(12) United States Patent
Lee et al.

(10) Patent No.: US 7,869,478 B2
(45) Date of Patent: Jan. 11, 2011

(54) APPARATUS AND METHOD FOR MAINTAINING CONSTANT EXTINCTION RATIO OF LASER DIODE

(75) Inventors: Joon Ki Lee, Daejeon (KR); Jyung Chan Lee, Daejeon (KR); Kwangjoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/635,196

(22) Filed: Dec. 7, 2006

(65) Prior Publication Data

US 2007/0133634 A1    Jun. 14, 2007

(30) Foreign Application Priority Data

Dec. 12, 2005    (KR) .................... 10-2005-0121977

(51) Int. Cl.
  *H01S 5/042* (2006.01)
  *H01S 5/068* (2006.01)
  *H01S 5/0683* (2006.01)
(52) U.S. Cl. ............. 372/38.07; 372/38.02; 372/29.021
(58) Field of Classification Search ............... 372/38.07, 372/38.02, 29.021
 See application file for complete search history.

(56) References Cited

U.S. PATENT DOCUMENTS 6,301,279 B1 * 10/2001 Garbuzov et al. ............. 372/36

6,771,679 B2    8/2004 Schie
2003/0007525 A1 *  1/2003 Chen ............................ 372/31
2003/0174746 A1 *  9/2003 Lano et al. .................... 372/33

FOREIGN PATENT DOCUMENTS

| KR | 10-2000-0060107 | 10/2000 |
| KR | 10-2000-0060108 | 10/2000 |
| WO | WO 93-013577 | 7/1993 |

* cited by examiner

*Primary Examiner*—Minsun Harvey
*Assistant Examiner*—Michael Carter
(74) *Attorney, Agent, or Firm*—Ladas & Parry LLP

(57) ABSTRACT

Provided are an apparatus and method for maintaining an constant extinction ratio of a laser diode (LD). The apparatus includes: an automatic power control circuit maintaining the constant optical power of the LD; a correlation deriver deriving correlations between a bias current of the LD and a modulation current to maintain the constant extinction ratio of the LD; and a modulation current control circuit controlling the modulation current to maintain constant the extinction ratio of the LD based on the correlations. The apparatus and method do not use a temperature sensor but derive a relationship between variances of a bias current of the LD and a modulation current according to temperature change, control the modulation current based on the relationship, and maintain the constant extinction ratio of the LD.

16 Claims, 9 Drawing Sheets

APPARATUS AND METHOD FOR MAINTAINING CONSTANT EXTINCTION RATIO OF LASER DIODE

CROSS-REFERENCE TO RELATED PATENT APPLICATION

This application claims the benefit of Korean Patent Application No. 10-2005-0121977, filed on Dec. 12, 2005, in the Korean Intellectual Property Office, the disclosure of which is incorporated herein in its entirety by reference.

BACKGROUND OF THE INVENTION

1. Field of the Invention

The present invention relates to an apparatus and method for maintaining a constant extinction ratio of a laser diode of an optical transceiver, and more particularly, to an apparatus and method for maintaining a constant extinction ratio using correlations between a bias current and a modulation current.

2. Description of the Related Art

FIGS. 1A and 1B are graphs of a characteristic curve of a laser diode (LD) according to an increase in temperature. Referring to FIG. 1B, the characteristic curve of the LD shows that a threshold current $I_{th}$ increases and the slope of the characteristic curve decreases as the temperature increases, or the deterioration of the performance of the LD.

When the slope of the characteristic curve decreases as stated above and the LD is operated using a bias current and a modulation current that are identical, optical power level and the extinction ratio are reduced causing deterioration in the transmission performance of the LD.

The extinction ratio indicates the ratio of two optical power levels 0 and 1 in a digital optical transport, and is expressed in dB.

Since a receiver can easily determine the optical power levels 0 and 1 as the extinction ratio increases, the extinction ratio is one of the important performance parameters that a transmitter must maintain constantly even if temperatures increase or there are changes in the environment.

FIGS. 2A and 2B are graphs of a characteristic curve of an LD with an automatic power control (APC). Referring to FIG. 2, most optical transceivers usually used in an optical communication system, are manufactured to maintain optical power through APC even when the slope of the characteristic curve of the LD decreases.

A thermistor or temperature sensor was used in order to compensate for a reduction of the extinction ratio of the LD, as shown in FIG. 3.

However, since the method of compensating for the reduction of the extinction ratio by sensing the change in the temperature and using the feedback circuit for changing the modulation current compensates for a change in the modulation current according to the change in the temperature using a linear function that has one slope, it is impossible to maintain the constant extinction ratio over the broad temperature range.

SUMMARY OF THE INVENTION

The present invention provides an apparatus and method for maintaining an extinction ratio of a laser diode (LD) using a relationship between two parameters based on an experiment where there are correlations between a bias current for obtaining a constant optical power level and a modulation current to obtain a constant extinction ratio.

According to an aspect of the present invention, there is provided an apparatus for maintaining a constant extinction ratio of a laser diode (LD), the apparatus comprising: an automatic power control circuit maintaining the constant optical power of the LD; a correlation deriver deriving correlations between a bias current of the LD and a modulation current to maintain the constant extinction ratio of the LD; and a modulation current control circuit controlling the modulation current to maintain the constant extinction ratio of the LD based on the correlations.

According to another aspect of the present invention, there is provided a method of maintaining a constant extinction ratio of an LD, the method comprising: controlling an automatic power for maintaining constant optical power of the LD; deriving correlations between a bias current of the LD and a modulation current to maintain the constant extinction ratio of the LD; and controlling the modulation current to maintain the constant extinction ratio of the LD based on the correlations.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will be described more fully hereinafter with reference to the accompanying drawings in which preferred embodiments of the invention are shown.

Figure 1:
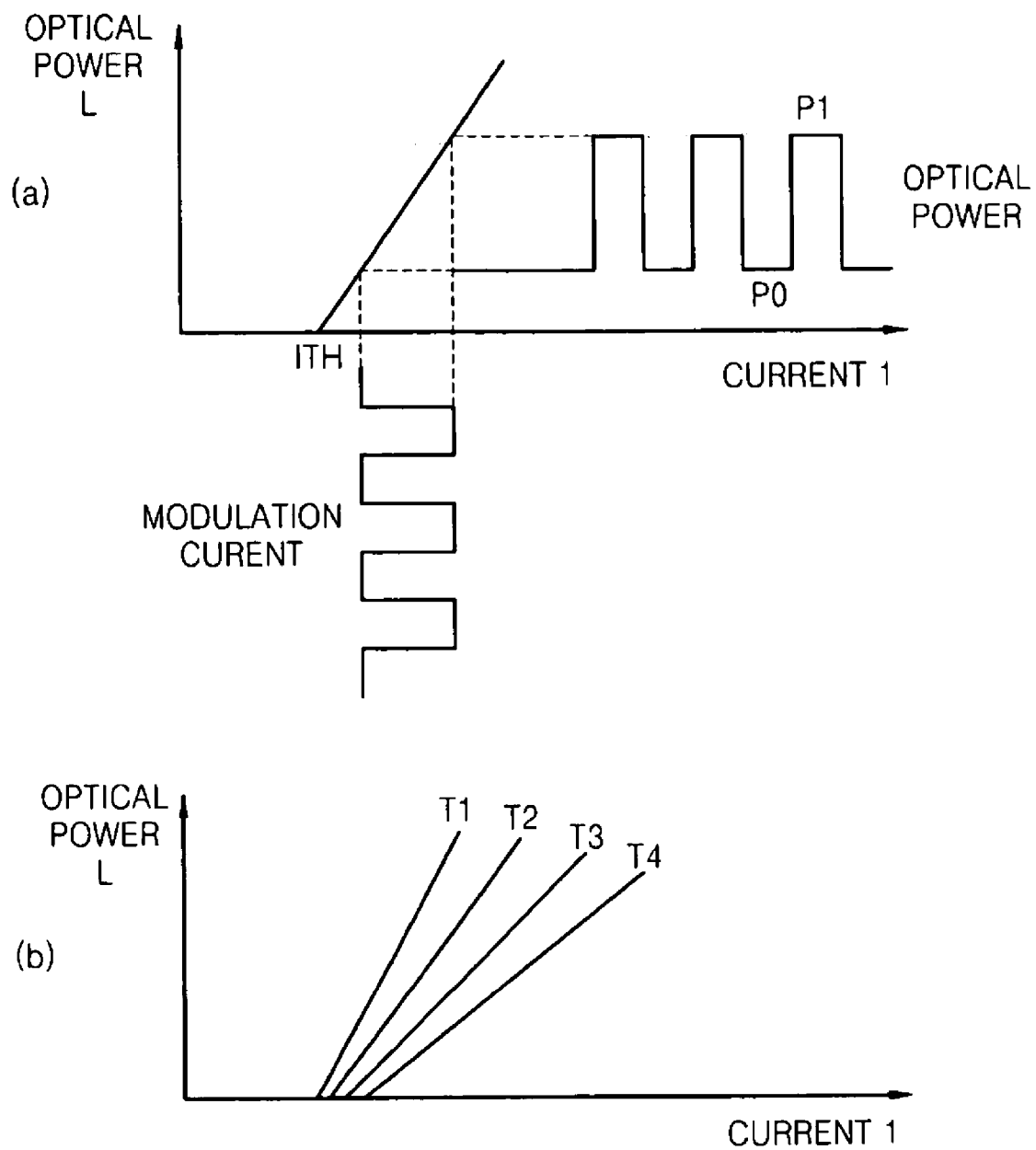
FIG. 1 is a graph of a characteristic curve of a laser diode (LD) according to an increase in a temperature.
Figure 2:
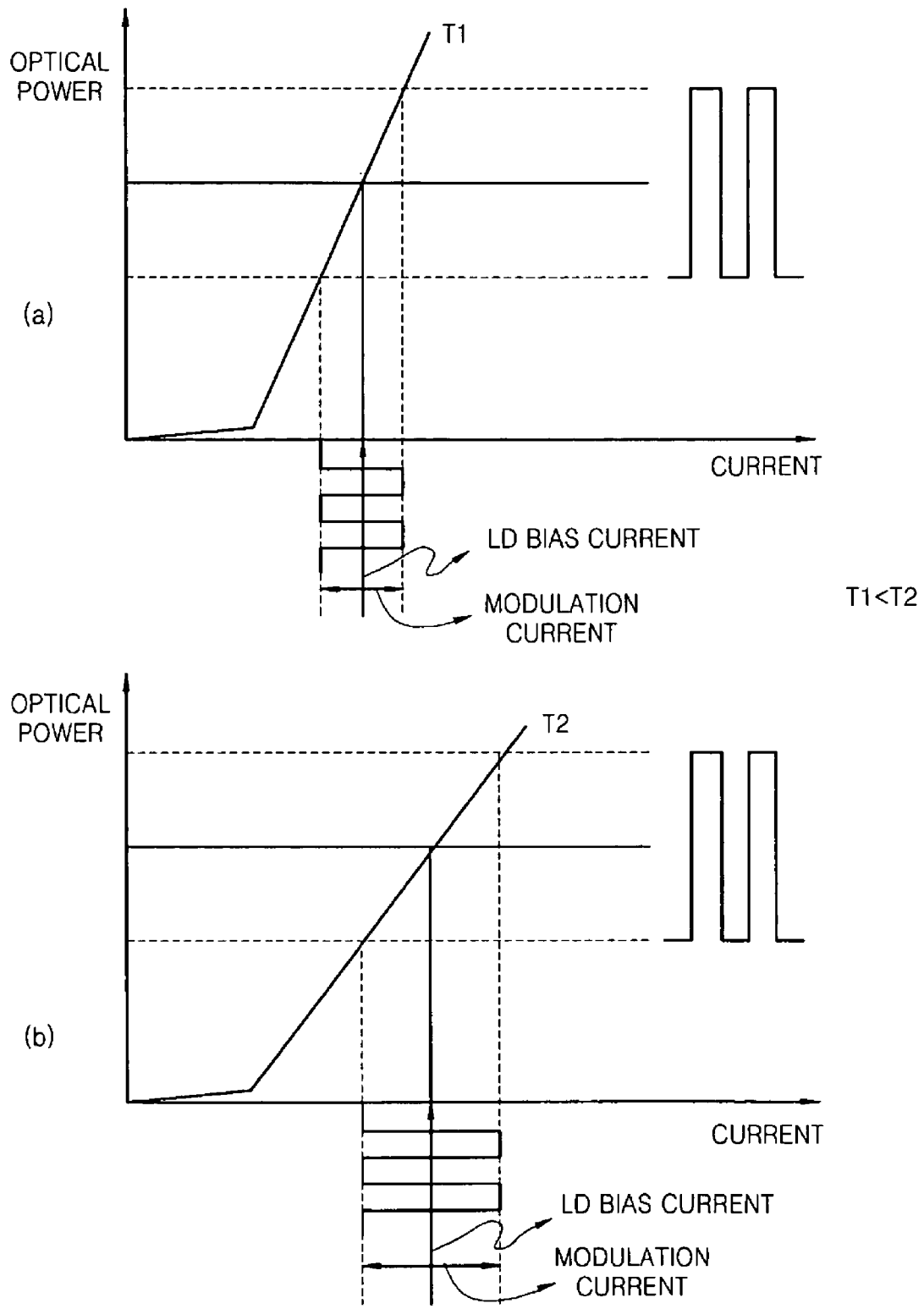
FIG. 2 is a graph of a characteristic curve of an LD including an automatic power control.
Figure 3:
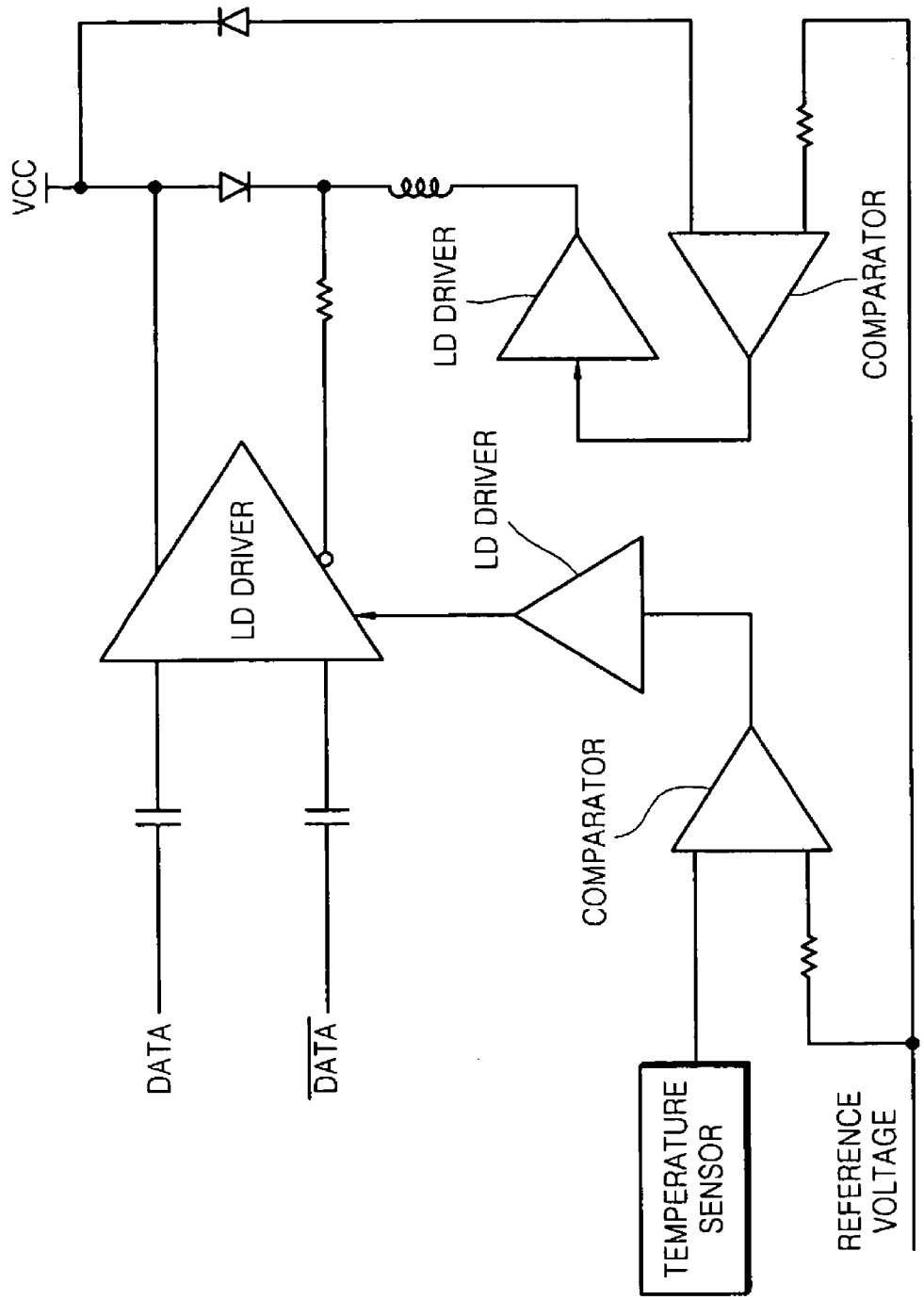
FIG. 3 is a block diagram of a conventional apparatus for compensating for a reduction in an extinction ratio of an LD.
Figure 4:
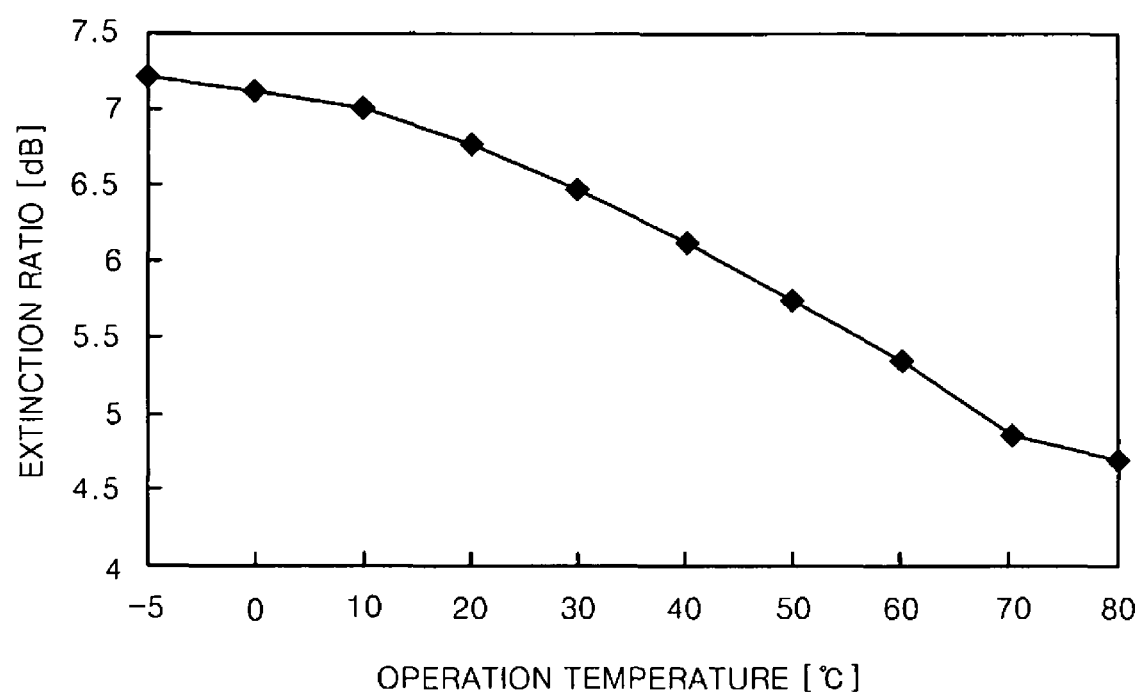
FIG. 4 is a graph of an extinction ratio versus temperature of an LD according to an embodiment of the present invention.

FIG. 4 is a graph of an extinction ratio versus temperature of a laser diode (LD) according to an embodiment of the present invention. Referring to FIG. 4, the extinction ratio of optical power varies as the temperature varies, thus influencing the transmission performance of the LD.

The variation of the extinction ratio forms a curve as the temperature varies. In detail, a conventional method of compensating for the extinction ratio using a linear function in which a modulation current varies according to temperature cannot maintain the constant extinction ratio over the broad temperature range.

Figure 5:
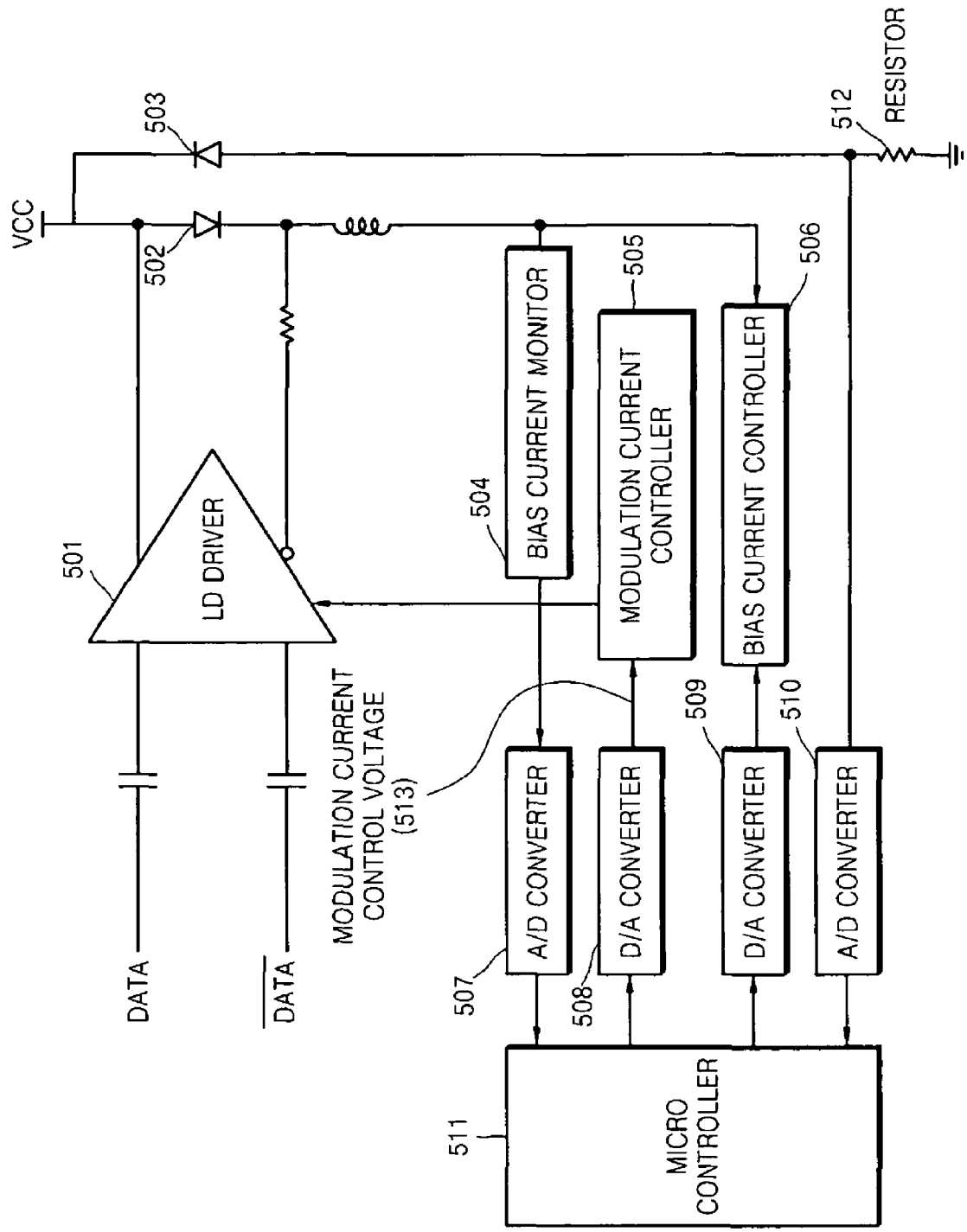
FIG. 5 is a block diagram of an apparatus for compensating for the extinction ratio of an LD according to an embodiment of the present invention.

FIG. 5 is a block diagram of an apparatus for compensating for the extinction ratio of an LD according to an embodiment of the present invention. Referring to FIG. 5, the apparatus for compensating for the extinction ratio of the LD comprises a hardware block including a laser diode driver 501, a modulation current controller 505, a bias current monitor 504, a bias current controller 506, a pair of A/D converters 507 and 510, a pair of D/A converters 508 and 509, and a micro controller 511, and a software block including a first operation of deriving a relationship between a bias current and a modulation current according to temperature by using the hardware block, and a second operation of automatically changing the modulation current according to a change in bias current based on the relationship derived in the first operation.

The operating principle of the apparatus will be described. To maintain constant optical power, the micro controller 511 outputs a control signal with an analog voltage to the bias current controller 506 via the D/A converter 509 so that a bias voltage can be applied to the LD 502, through which a current flows.

An optical power level is changed to a voltage signal via a monitor photodiode (PD) 503 and a resistor 512. The voltage signal is converted into a digital signal by the A/D converter 510 and is input to the micro controller 511.

A feedback circuit makes it possible to maintain a target optical power level by controlling the bias current controller 506 so as to maintain a constant voltage input from the A/D converter 510 to the micro controller 511. The bias current monitor 504 monitors current that flows into the LD 502, thereby controlling the modulation current based on correlations between the bias current and the modulation current, which will be described in detail later.

The apparatus for compensating for the extinction ratio of the LD of the current embodiment of the present invention does not use a temperature sensor but monitors the bias current of the LD 502 and increases or decreases the modulation current accordingly.

Figure 6:
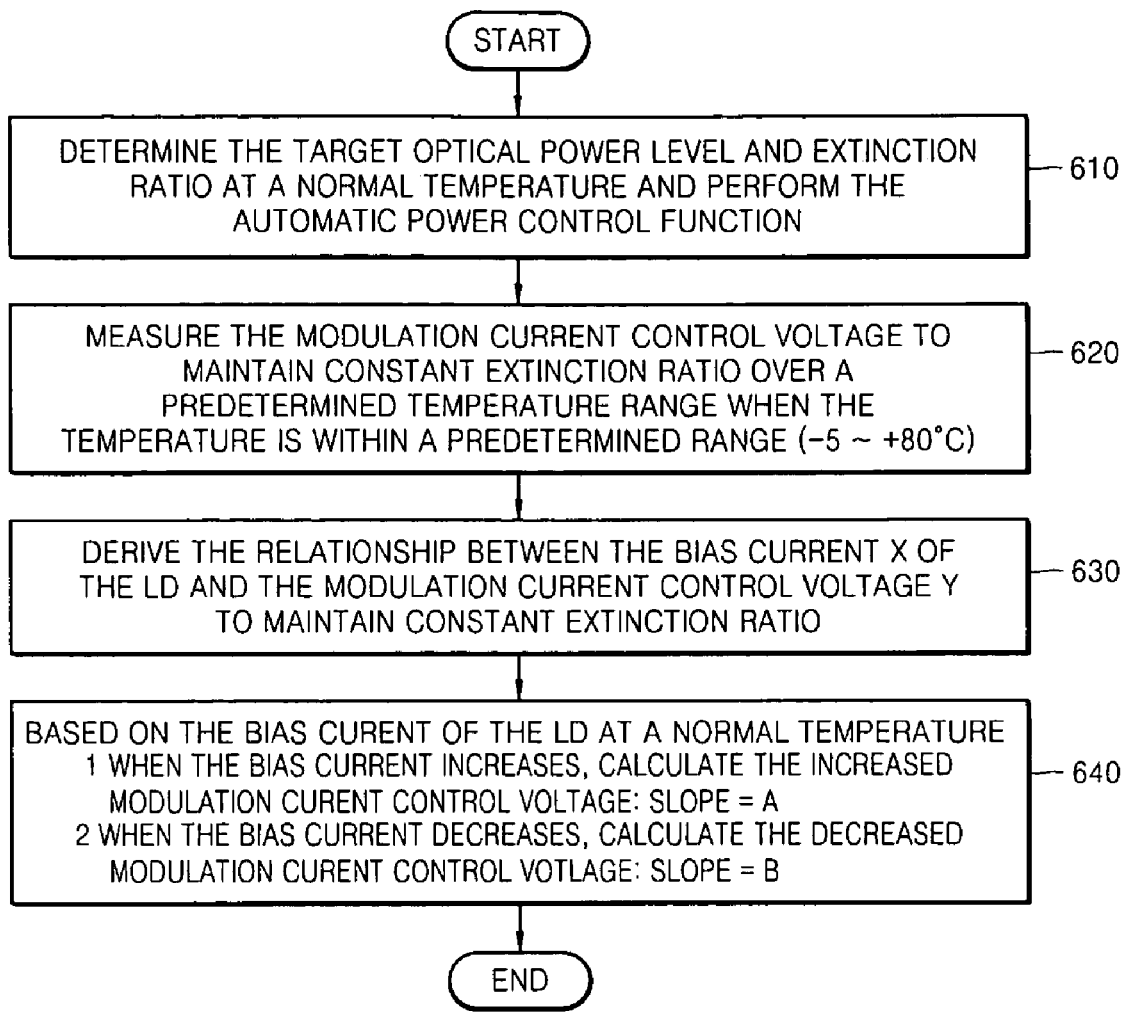
FIG. 6 is a flowchart of a method of deriving a relationship between a bias current and a modulation current according to temperature, according to an embodiment of the present invention.

FIG. 6 is a flowchart of a method of deriving a relationship between a bias current and a modulation current according to temperature, according to an embodiment of the present invention.

Referring to FIG. 6, the bias current is determined to output a target optical power level at a normal temperature and an automatic power control (APC) function is performed (Operation 610). A modulation current control voltage 513 is applied to the modulation current controller 505 so as to satisfy a target extinction ratio.

The modulation current control voltage 513 is measured to maintain the constant extinction ratio over a predetermined temperature range, e.g., −5~+80° C. (Operation 620).

Figure 7:
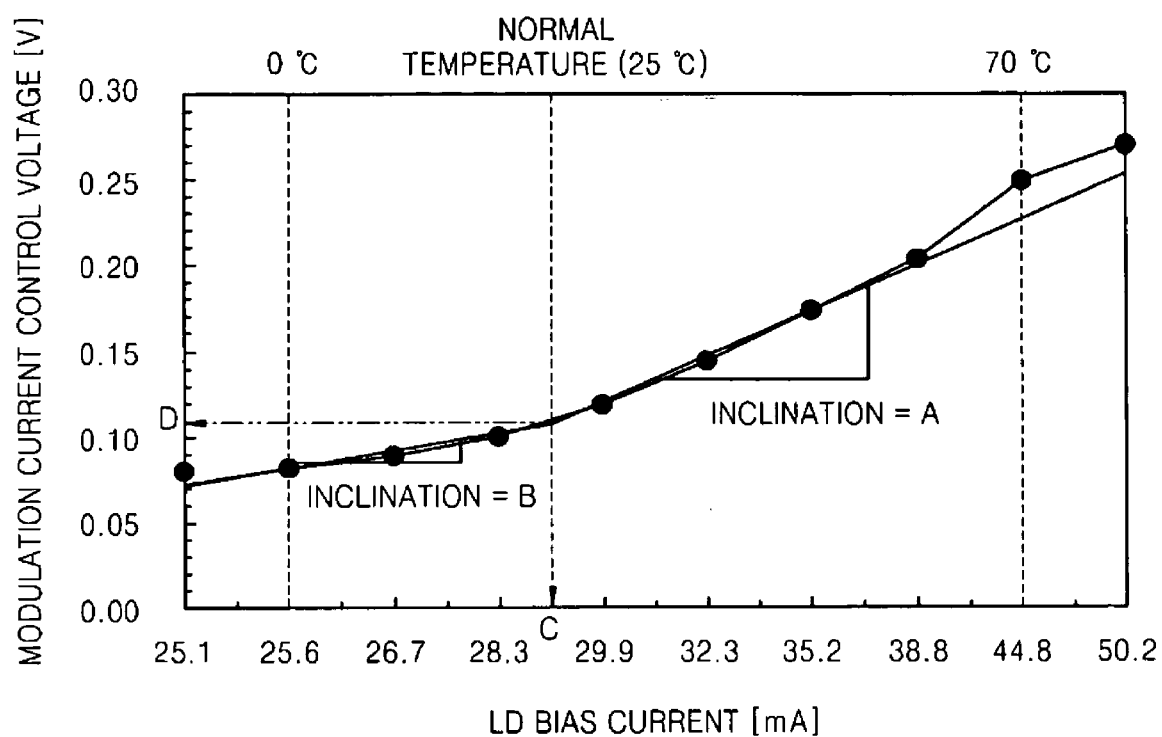
FIG. 7 is a graph of correlations between a bias current and a modulation current control voltage according to temperature of the LD according to an embodiment of the present invention.

The relationship between the bias current X and the modulation current control voltage Y is derived to maintain the extinction ratio when the temperature is within a predetermined range (Operation 630) as illustrated in FIG. 7.

FIG. 7 is a graph of correlations between the bias current and the modulation current control voltage according to temperature of the LD, according to an embodiment of the present invention.

When the bias current increases relative to the bias current at a normal temperature, the increase in modulation current control voltage is measured to calculate slope A, and when the bias current decreases relative to the bias current at a normal temperature, the increase in modulation current control voltage is measured to calculate slope B (Operation 640).

The calculated slopes A and B remain unchanged unless the product model of LD 502 or the LD driver 501 is changed. Therefore, if the experiment is only conducted at an initial stage of development or production, the calculated slopes A and B ensure the extinction ratio to be maintained by separately programming the optical transceivers as illustrated in FIG. 8.

Figure 8:
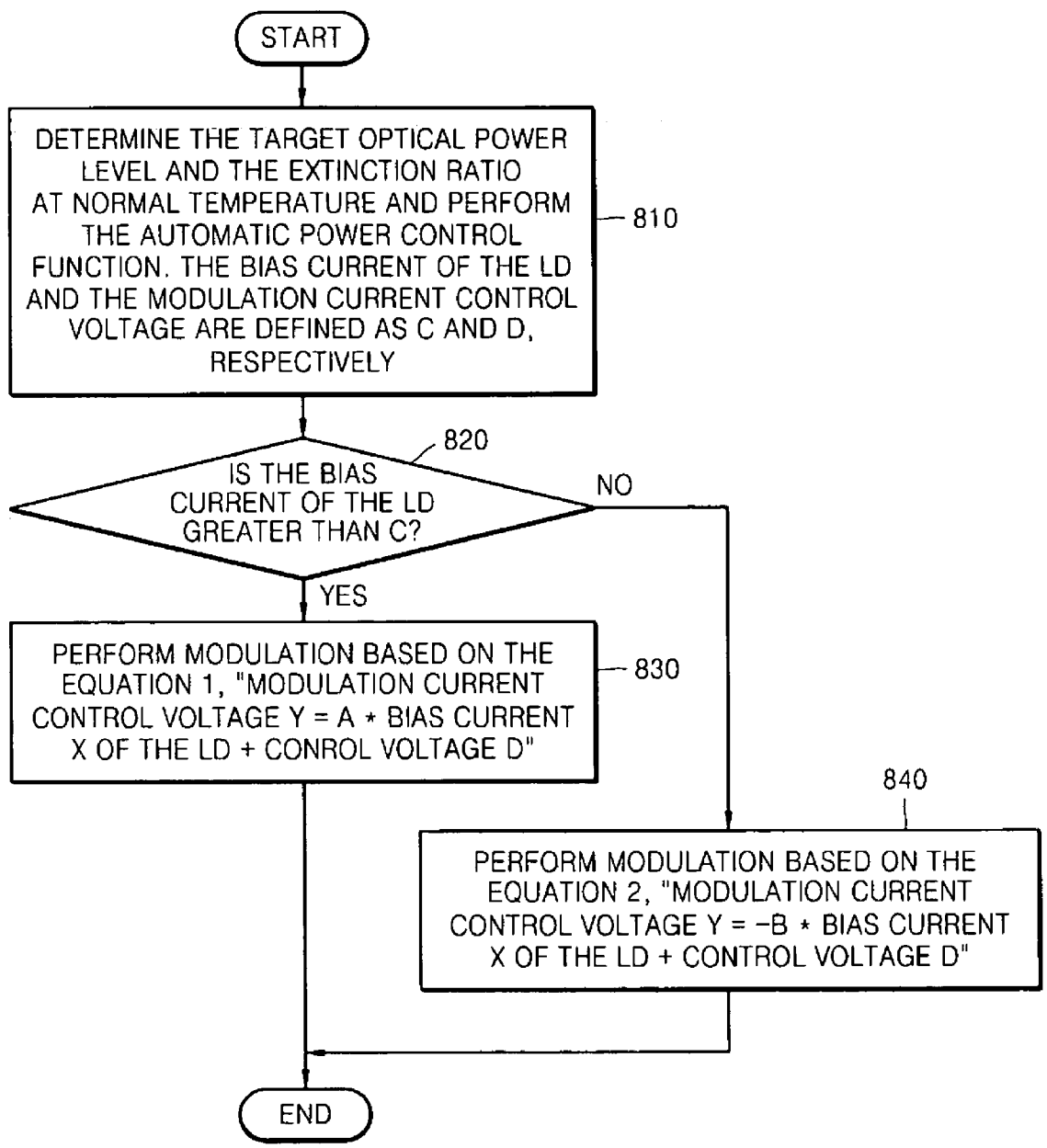
FIG. 8 is a flowchart of a method of programming an automatic variance of modulation current control voltage according to a bias current change based on the relationship between a bias current and a modulation current control voltage, according to an embodiment of the present invention.

FIG. 8 is a flowchart illustrating an operation of programming an automatic variance of a modulation current control voltage according to a bias current based on the relationship between the modulation current control voltage and the bias current, according to an embodiment of the present invention.

Referring to FIG. 8, a bias current C is determined to output a target optical power level at a normal temperature and the APC function is performed. A control voltage D (a modulation current control voltage 513 in FIG. 5) is applied to the modulation current controller 505 so as to attain a target extinction ratio (Operation 810).

When the bias current is greater than the determined bias current C (Operation 820), a modulation current control voltage Y (a modulation current control voltage 513 in FIG. 5) obtained from Equation 1 is applied to the modulation current controller 505 (Operation 830).

$$\text{Modulation Current Control Voltage } Y = \text{slope } A \times \text{Bias Current } X + \text{control voltage } D \quad (1)$$

When the bias current is less than the determined bias current C (Operation 820), a modulation current control voltage Y (a modulation current control voltage 513 in FIG. 5) obtained from Equation 2 is applied to the modulation current controller 505 (Operation 840).

$$\text{Modulation Current Control Voltage } Y = -\text{slope } B \times \text{Bias Current } X + \text{control voltage } D \quad (2)$$

Figure 9:
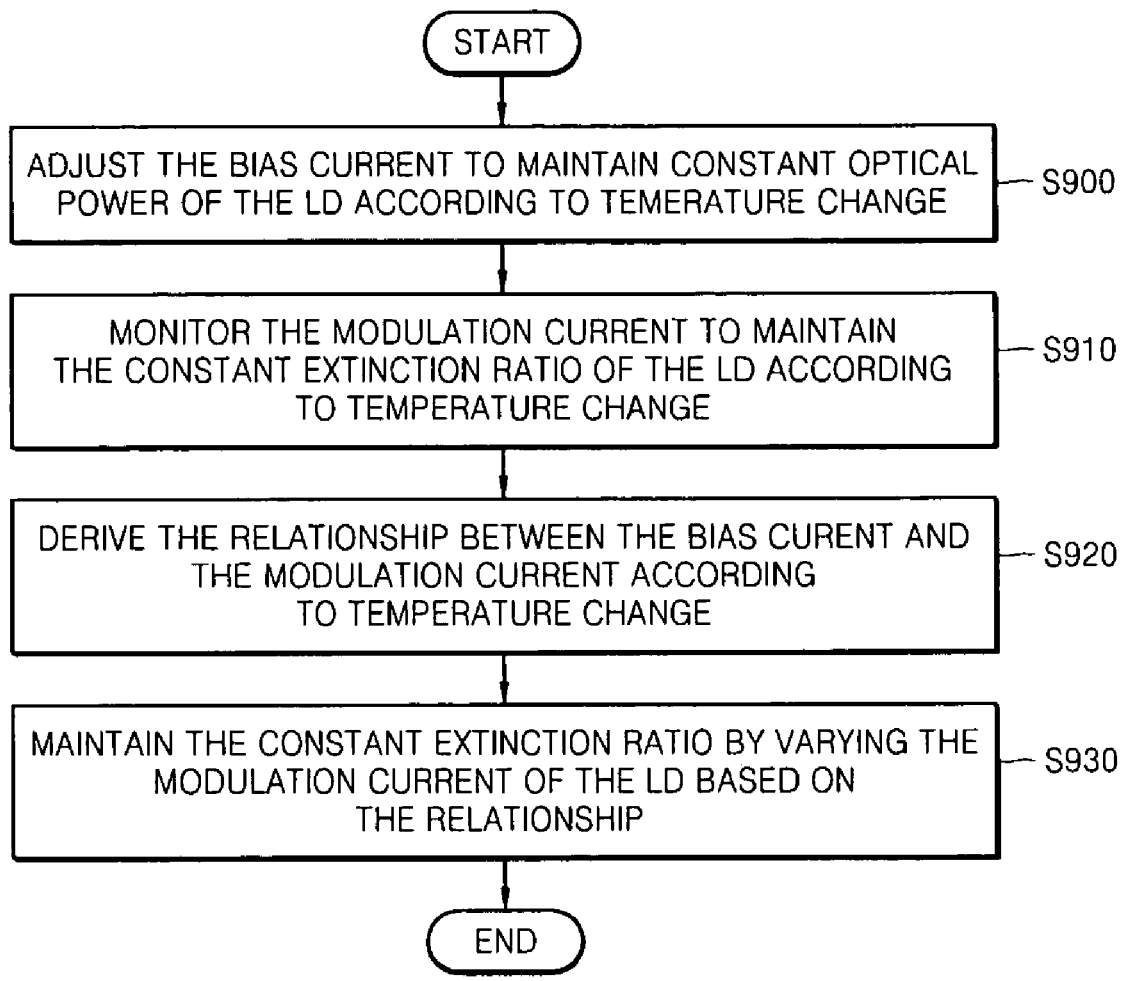
FIG. 9 is a flowchart of an operation used by an apparatus for maintaining an extinction ratio of the LD according to an embodiment of the present invention.

FIG. 9 is a flowchart of an operation used by an apparatus for maintaining a constant extinction ratio of an LD according to an embodiment of the present invention.

Referring to FIG. 9, a bias current is adjusted to maintain a constant optical power of the LD according to the temperature (Operation 900).

A modulation current is monitored to maintain the constant extinction ratio of the LD according to the temperature (Operation 910).

A relationship between the bias current and the modulation current according to temperature is derived (Operation 920).

The modulation current of the LD is changed based on the relationship between the bias current and the modulation current to maintain the extinction ratio (Operation 930).

The apparatus and method for maintaining a constant extinction ratio of an LD according to the present invention have the following advantages.

The apparatus and method for maintaining an extinction ratio using correlations between an a bias current and an a modulation current of an LD according to the present invention compensate for a reduction in the extinction ratio according to a characteristic curve variance of the LD according to temperature and a characteristic curve variance due to a deterioration in performance of the LD.

The method of the present invention is more accurate than a method of compensating for the modulation current according to the temperature changes using a linear function over the broad temperature range.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for maintaining a constant extinction ratio of a laser diode (LD) as a function of temperature, the apparatus comprising:
   an automatic power control (APC) circuit maintaining a constant optical power of the LD as a function of temperature by using empirical non-linear static reference values stored in the apparatus in which the empirical non-linear static reference values are previously obtained from a prototype of a given product model of the LD of the apparatus and not obtained from the apparatus, wherein the empirical non-linear static reference values are associated with modulation current control voltage data and LD bias current data from the prototype as a function of temperature;
   a correlation deriver deriving linear correlations from within the empirical non-linear static reference values of the prototype by using a monitored bias current of the LD such that the correlation deriver is used to maintain the constant extinction ratio of the LD when a monitored optical power level of the LD is found not to be equal to the constant optical power level of the LD; and
   a modulation current control circuit controlling the modulation current to maintain the constant extinction ratio of the LD based on the correlations,
   wherein the apparatus does not use a temperature sensor,
   wherein when the monitored optical power is below the constant optical power then the monitored bias current corresponds to a temperature below a normal working temperature of the LD and the inclination has the formula:

slope $A = (\Delta$ modulation current control voltage$)/(\Delta$ bias current$)$ wherein ($\Delta$ modulation current control voltage) is the change in modulation current control voltage, and the ($\Delta$ bias current) is the change in bias current and is centered at or near the monitored bias current,
   wherein the modulation current control circuit controlling the modulation current control voltage uses the following function:

$Y = +$(slope $A$)$\times$(monitored bias current)$+$(current $C$)

wherein the (current $C$) is defined as the bias current at the normal working temperature of the LD.

2. The apparatus of claim 1, wherein the automatic power control circuit comprises:
   a bias current controller adjusting the bias current of the LD;
   an optical power monitor monitoring an optical power level of the LD that varies according to the bias current; and
   a micro controller controlling the bias current controller to maintain the constant optical power level of the LD.

3. The apparatus of claim 1, wherein the correlation deriver comprises:
   a bias current monitor monitoring the monitored bias current of the LD;
   a modulation current monitor monitoring a varying modulation current to maintain the constant extinction ratio of the LD; and
   an arithmetic operator deriving correlations between the monitored bias current and the varying modulation current using the empirical non-linear static reference values.

4. The apparatus of claim 1, wherein the modulation current control circuit comprises:
   a modulation current controller adjusting the modulation current of the LD; and
   a micro controller controlling the modulation current controller to maintain the constant extinction ratio of the LD.

5. A method of maintaining a constant extinction ratio of an laser diode (LD), the method comprising:
   monitoring an optical power level of the LD;
   controlling an automatic power for maintaining a constant optical power of the LD as a function of temperature by using empirical non-linear static reference values stored in the LD which are previously obtained from a prototype of a given product model of the LD and not obtained by the LD and by using monitored bias current, wherein the empirical non-linear static reference values are temperature dependent and associated with modulation current control voltage data and LD bias current data from a prototype of a given product model of the LD;
   deriving linear correlations from within the empirical non-linear static reference values of the prototype by using a monitored bias current of the LD such that the derived linear correlations are used to maintain the constant extinction ratio of the LD when the monitored optical power level of the LD is found not to be equal to the constant optical power level of the LD; and
   controlling the modulation current to maintain the constant extinction ratio of the LD based on the linear correlations
   wherein the method does not use a temperature sensor,
   wherein when the monitored optical power is below the constant optical power then the monitored bias current corresponds to a temperature below a normal working temperature of the LD wherein the inclination having the formula:

slope $A = (\Delta$ modulation current control voltage$)/(\Delta$ bias current$)$ wherein the ($\Delta$ modulation current control voltage) is the change in modulation current control voltage, and the ($\Delta$ bias current) is the change in bias current and is centered at or near the monitored bias current,
   wherein the modulation current control circuit controlling the modulation current control voltage uses the following function:

$Y = +$(slope $A$)$\times$(monitored bias current)$+$(current $C$)

wherein the (current $C$) is defined as the bias current at the normal working temperature of the LD.

6. The method of claim 5, wherein the controlling of the automatic power comprises:
   monitoring an optical power level of the LD varying according to a change in the monitored bias current of the LD; and
   controlling the bias current to maintain the constant optical power level of the LD.

7. The method of claim 5, wherein the deriving of the correlation comprises:
   monitoring the monitored bias current of the LD;
   monitoring a varying modulation current for maintaining the constant extinction ratio of the LD; and deriving correlations between the monitored bias current and the varying modulation current using the empirical non-linear static reference values.

8. The apparatus of claim 1, wherein the empirical non-linear static reference values corresponds to when the extinction ratio of the LD is maintained substantially constant and when the LD temperature varies.

9. The apparatus of claim 1, wherein the empirical non-linear static reference values corresponds to a non-linear relationship between the modulation current control voltage data and LD bias current data.

10. The apparatus of claim 1 wherein the correlation deriver deriving linear correlations from the empirical non-linear static reference values such that the derived linear correlations have having inclinations defined as a change of the modulation current control voltage data divided by a change in the LD bias current data when the change in the LD bias current data is centered at or near the monitored bias current.

11. The apparatus of claim 10 wherein when the monitored optical power is below the constant optical power then the monitored bias current corresponds to a temperature above a normal working temperature of the LD and the inclination has the formula:

$$\text{slope } B = (\Delta \text{ modulation current control voltage})/(\Delta \text{ bias current})$$

wherein the ($\Delta$ modulation current control voltage) is the change in modulation current control voltage, and the ($\Delta$ bias current) is the change in bias current and is centered at or near the monitored bias current.

12. The apparatus of claim 11 wherein the modulation current control circuit controlling the modulation current control voltage uses the following function:

$$Y = -(\text{slope } B) \times (\text{monitored bias current}) + (\text{current } C)$$

wherein the (current C) is defined as the bias current at the normal working temperature of the LD.

13. The method of claim 5 wherein the reference values correspond to a non-linear relationship between the modulation current control voltage data and LD bias current data.

14. The method of claim 5 wherein the deriving correlations comprises deriving linear correlations from the empirical non-linear static reference values having inclinations defined as a change of the modulation current control voltage data divided by a change in the LD bias current data when the change in the LD bias current data is centered at or near the monitored bias current.

15. The method of claim 14 wherein when the monitored optical power is below the constand optical power then the monitored bias current corresponds to a temperature above a normal working temperature of the LD wherein the inclination having the formula:

$$\text{slope } B = (\Delta \text{ modulation current control voltage})/(\Delta \text{ bias current})$$

wherein the ($\Delta$ modulation current control voltage) is the change in modulation current control voltage, and the ($\Delta$ bias current) is the change in bias current and is centered at or near the monitored bias current.

16. The method of claim 15 wherein the modulation current control circuit controlling the modulation current control voltage uses the following function:

$$Y = -(\text{slope } B) \times (\text{monitored bias current}) + (\text{current } C)$$

wherein the (current C) is defined as the bias current at the normal working temperature of the LD.

* * * * *